(12) United States Patent
Dickinson et al.

(10) Patent No.: US 6,333,137 B1
(45) Date of Patent: Dec. 25, 2001

(54) SCREEN PRINTING STENCIL

(75) Inventors: Peter Dickinson; Nicholas R. Collins, both of Kent (GB)

(73) Assignee: Sericol Limited, Kent (GB)

( * ) Notice: Subject to any disclaimer, the term of this patent is extended or adjusted under 35 U.S.C. 154(b) by 0 days.

(21) Appl. No.: 09/172,663

(22) Filed: Oct. 15, 1998

(30) Foreign Application Priority Data

Oct. 17, 1997 (GB) .................................................... 9721973

(51) Int. Cl.[7] ............................. G03C 1/725; G03C 1/73; G03C 1/76; G03F 7/12; C08J 3/28
(52) U.S. Cl. .................. 430/287.1; 430/308; 430/281.1; 430/270.1; 430/271.1; 522/71; 522/74; 522/110; 522/135
(58) Field of Search ................................. 430/308, 270.1, 430/271.1, 281.1, 287.1; 522/71, 74, 110, 135

(56) References Cited

U.S. PATENT DOCUMENTS

| 3,386,848 | * | 6/1968 | Dereich | 427/282 |
|---|---|---|---|---|
| 4,272,620 | | 6/1981 | Ichimura | 525/61 |
| 5,204,222 | * | 4/1993 | Gersdorf et al. | 430/281.1 |
| 5,246,815 | | 9/1993 | Ichimura | 430/270.1 |
| 5,332,651 | * | 7/1994 | Dickinson et al. | 430/270.1 |
| 5,537,137 | * | 7/1996 | Held et al. | 347/105 |

FOREIGN PATENT DOCUMENTS

| 0 220 121 | 4/1987 | (EP) . |
|---|---|---|
| 0 373 862 | 6/1990 | (EP) . |

* cited by examiner

*Primary Examiner*—Janet Baxter
*Assistant Examiner*—Sim J. Lee
(74) *Attorney, Agent, or Firm*—Nixon & Vanderhye P.C.

(57) ABSTRACT

A photopolymerizable composition for making screen printing stencils. The composition comprises polyvinyl alcohol having at least one photocrosslinkable group appended thereto. At least one metal salt, wherein the metal is selected from: aluminum, zinc, chromium, zirconium, titanium, tin or iron, is added to the composition. The metal salt is used to improve water resistance of a screen printing image that is prepared from the photopolymerizable composition.

23 Claims, No Drawings

SCREEN PRINTING STENCIL

This invention concerns a screen printing stencil, and more particularly a photocurable composition for the production of a screen printing stencil.

In the screen printing process ink is forced through a mesh of a polymer (usually polyester) or of stainless steel stretched over a wooden or metal frame, using a squeegee. In the areas of mesh where printing is not to be effected the mesh is covered with a negative of the print design, known as a stencil. The stencil is composed of a material impervious to the ink to be used for the printing and is usually formed by imagewise exposure of the areas to form the stencil and subsequent aqueous development.

Many methods have been proposed for the production of screen printing stencils. Stencils can be prepared either independently of the screen, by the indirect method, or on the screen itself by the direct method.

In the indirect method, a photosensitive layer of emulsion is coated on to a temporary support sheet, usually a transparent polyester sheet, and following exposure to actinic light the layer of emulsion is developed on the support sheet, using water to remove unexposed areas of the photosensitive layer. The wet stencil on its support is then adhered to the screen by the application of gentle, even pressure. After drying, the support sheet is removed, leaving the stencil on the screen mesh ready for printing.

In the direct method, a photosensitive emulsion is coated on to a mesh and dried to give a continuous, even film. A stencil is then produced by imaging the coating directly with a laser, or photographically through a line or half tone positive, and then developing an image by removing unexposed areas of the film with water.

A further technique, the so-called 'capillary film' method, involves the application of a photosensitive layer to a polyester sheet, which is then transferred to a mesh prior to imaging. Imaging and development are then effected as described for the direct method.

Combinations of emulsions and films are also possible in which a direct emulsion is used to adhere a film to a mesh. Development of the stencil is then as with the direct method.

The photosensitive coatings for all these techniques are polymer based, and formulated to achieve chemical, thermal and mechanical resistance in use and during manufacture, dimensional stability, flexibility, maintenance of light stability and impermeability to liquids.

Compositions used to prepare screen printing stencils are in general based on water soluble colloids, usually polyvinyl alcohols, which act as binder resins. The compositions are such that areas of the coatings irradiated by actinic light become insoluble in water and remain on the screen after development, while areas protected from actinic light retain their water solubility and are easily washed away with water.

Image development with water necessitates rendering a coating of a water soluble colloid binder insoluble to water as a consequence of exposure to actinic light. This can be achieved either by crosslinking the colloid or by forming a secondary polymer matrix within the coating structure, thereby preventing redispersion.

A secondary polymer matrix insoluble in water is formed by photopolymerising compositions containing photopolymerisable monomers and/or oligomers possessing light sensitive groups, or to which a photoinitiator system has been added. Oligomers are preferred because the rate of insolubilisation of the compositions on exposure is usually more rapid, presumably due to a rapid establishment of a network polymer structure and also because of their lower rate of evaporation on drying. Unfortunately, stencils made entirely of secondary polymer matrix cannot be easily removed after printing as the matrix is not easily degraded.

Crosslinking of colloids can be achieved by a number of methods using ultra-violet or visible radiation. Colloidal polymer molecules having reactive groups along the polymer chain can crosslink with other polymer molecules via such groups. Alternatively a photochemically activated crosslinking agent can be used. The resultant increase in molecular weight of the colloid reduces its solubility in water.

Important requirements for colloidal binder resins for producing screen printing stencils are solvent resistance, decoatability and water solubility. Polyvinyl alcohol derivatives meet all these requirements as well as having good mechanical strength and heat resistance. Furthermore, the removal of polyvinyl alcohol based coatings following printing is simply achieved by selectively oxidising the 1,2-diol groups on the polymer chain, for example, by applying a sodium metaperiodate solution. This is known as the decoating process.

The water solubility of polyvinyl alcohol derivatives is related both to their molecular weight and to their degree of hydrolysis. In general, they are rendered water soluble when at least 70% of the acetate groups of the precursor polyvinyl acetate are hydrolysed to hydroxy groups. Totally hydrolysed polyvinyl alcohols are only slightly soluble in cold water as a result of strong intermolecular hydrogen bonding. Lower molecular weight grades of polyvinyl alcohol tend to be more soluble in water than higher molecular weight grades.

The use of polyvinyl alcohol in photocrosslinkable compositions for producing screen printing stencils is well known in the art. Original systems were photosensitised by adding a dichromate compound or polymeric diazonium salt. An improved method of crosslinking polyvinyl alcohol is described in British Patent specifications 2030575, 2288402, 2288403 and 2226564, and European Patents 0373537 and 0555070, in which pendant styryl pyridinium groups appended to the polyvinyl alcohol dimerise under the influence of actinic light. The resultant increase in the molecular weight of the polymer renders the coatings of the polymer insoluble in water, enabling stencil development to take place.

For environmental reasons water based screen printing inks are becoming increasingly popular and the need for stencils having good water resistance is increasing. If stencils do not have adequate water resistance they will swell, soften and be mechanically degraded by the printing processes, resulting in early stencil breakdown. Water based inks may also contain oligomers, monomers, surfactants and solvents, which increase the tendency of the stencil to soften and swell.

The problem with resistance to water of water based inks is more marked with stencils that have been photographically imaged using a projection system where actinic light is projected on to a distant screen through a positive smaller than the screen. Due to lower UV light intensities, the crosslinking is less effective than with direct exposure to actinic light through a full sized positive. Such exposure systems are now being more widely used. Furthermore, because of the low intensities, emulsions based on diazo sensitisers have too long an exposure time for practical use and, whilst dichromate sensitised emulsions have a shorter exposure time, they are not used for health reasons. Emulsions based on diazo and dichromate sensitisers need to have the sensitiser added just prior to use and have a limited life once sensitised. Emulsions based on styryl pyridinium groups are supplied presensitised and have a long useful life. Emulsions based on styryl pyridinium groups have a short enough exposure time when used on a projection system, are convenient to use as they do not need to be sensitised prior to use, and have a good useful life. Unfortunately, they do not have very good water resistance.

Skilled persons can formulate stencil making compositions to form stencils that will be inherently resistant to water based inks. However, the durability of such stencils is often inadequate for the print run required, especially when exposed with a projection system. Hydrophobic polymers can be introduced into the stencil making composition to produce stencils having improved water resistance; however, solvents are often required to clean water based inks from the stencils, and the solvents make the stencil more difficult to remove during the decoating process.

Water resistance of stencils can be achieved by post treating with solutions such as strong acids or by mixtures of acid and dialdehydes (for example, Super Hardener, which is available from Sericol Limited). These cause further crosslinking of the stencil rendering it impermeable to all solvent combinations encountered during the printing process. However, the resultant stencils are difficult, or impossible, to decoat from the mesh after printing. The mesh is an expensive component of the printing process so removal of used stencils and re-use is preferred on both economical and environmental grounds.

A more controllable solution to the problem can sometimes be achieved by the combination of diazo and styryl pyridinium sensitisers, in which the image is essentially formed using the rapid exposure of the styryl pyridinium salt and following development the stencil is given a second exposure to expose the residual diazonium salt, which cross links and also releases a fixed amount of strong acid in the process, hardening the stencil. This, however, has the disadvantage that the cross linking action continues and the stencil becomes progressively more difficult to decoat with time.

In accordance with the present invention there is provided a photopolymerisable composition for making screen printing stencils, the composition comprising polyvinyl alcohol having at least one photocrosslinkable group appended thereto, and at least one metal salt wherein the metal is selected from aluminium, zinc, chromium, zirconium, titanium, tin and iron.

The photocrosslinkable group is preferably a styryl pyridinium salt.

The metal salt is preferably a zirconium salt.

It has been surprisingly found that the addition of metal salts such as zirconium salts to stencil compositions based on, for example, stryryl pyridinium sensitisers increases the water resistance of the resultant stencil without loss of ease of removal. The addition of metal salts such as zirconium compounds in stencil making compositions serves to make stencils that can be used to print water based screen inks with longer print runs than the same composition without the zirconium compound. Furthermore, the used stencil can more easily be removed by treatment with periodate than with the composition without the zirconium salt, following removal of the ink from the stencil with a solvent. Thus, photoinsolubilised stencils can be prepared that: are water developable; have a fast exposure speed suitable for projection exposure use; have a long life; are resistant to water based inks and clean-up solvents; and are decoatable after use.

Other materials which can be included in the stencil making composition include fillers or extenders to increase the solids content, and additives which improve the performance of the compositions. Fillers or extenders can be used to increase the thickness or build of the deposited film of the compositions when they are used to form a stencil. Such fillers or extenders can be inert, film-formable or photopolymerisable in their own right. Suitable inert fillers include starch, kaolin, polytetrafluoroethylene, titanium dioxide and silica.

Hydrophobic polymers can also be added to the stencil making composition in the form of an aqueous dispersion stabilised by a surfactant or a water soluble colloid. Polyvinyl alcohol is particularly preferred as the stabiliser. Polymer dispersions can be produced with a high solids content, for example, up to 60% by weight, without imparting an excessively high viscosity to the compositions of the invention. In general, these dispersions impart greater water resistance to the stencil and promote adhesion to the screen mesh. Examples of suitable polymer dispersions include those of polyvinyl acetate, vinyl acetate/ethylene copolymers, vinyl acetate/acrylic ester copolymers and styrene/butadiene copolymers. However, if the hydrophobic polymers of the stencil composition come into contact with strong solvents, as used to clean screen printing inks from the screen, they can fuse making stencil removal difficult, if not impossible, depending on the amount used.

Other photopolymerisable materials can optionally be added to the stencil making composition. These materials can be photopolymerised to produce a secondary matrix, within a layer of the composition, which generally serves to enhance the properties of the layer. Hydrophobic and sparingly soluble compounds may be dissolved in a solvent compatible with the grafted polyvinyl alcohol. To obtain crosslinked products with good solvent resistance, compounds having at least two photocrosslinkable groups are preferred, for example, pentaerythritol triacrylate, pentaerythritol trimethacrylate, pentaerythritol tetracrylate, trimethylolpropane triacrylate, tripropyleneglycol diacrylate and triethyleneglycol diacrylate. It is preferred to use nonvolatile acrylate oligomers that are retained in the coating during the drying procedure.

Hydrophilic unsaturated compounds that can be used include those having an affinity for the aqueous polyvinyl alcohol phase. They can also serve to strengthen the polyvinyl alcohol phase in the compositions of the invention. Examples of such materials include N-vinylpyrrolidone, polyethylene glycol 200 diacrylate and Lankro RCP 2685, 2701, 2785 and 2850 (water dilutable UV curable acrylate resins).

Compositions of the invention can also include emulsion stabilisers, wetting agents, defoaming agents, buffers and/or plasticisers to improve their overall performance. In addition, it is usually preferred to include an inhibitor of thermal polymerisation. Furthermore, dyes or pigments can be included to provide visible stencils from the compositions.

The higher the acidity of the photosensitive composition, the greater the risk of reaction and insolubilisation after coating when the acid is concentrated. Thus, the compositions should have an acid concentration between pH 3.0–9.0, preferably between pH 3.0–7.0, to prevent the permanent effects of acid cross linking.

The following example is given by way of illustration only. All parts are by weight unless stated otherwise.

EXAMPLE 1

This example demonstrates exposure using a projection system. Dirasol 125 is a screen emulsion available from Sericol Ltd. Dirasol 125 includes a polyvinyl alcohol having styryl pyridinium salt appended thereto. Some of the Dirasol 125 was modified by the incorporation of 5% w/w of a 40% zirconium acetate solution. The pH of the modified emulsion was 4.2. Both the modified and unmodified emulsions were coated using one coat on to both sides of 150.34 TW white mesh screens using a Harlacher H41 automatic screen coating machine. The screens were allowed to dry and then exposed through a positive using Proka 400/280 projection exposure unit with a DV bulb at 10 times magnification for 80 secs. After development and drying the screens were assessed for water resistance following 1000 passes of a screen printing squeegee, with Aquaspeed FZ magenta line ink. After the test the screens were treated with Serisolve MC, a cleaning solvent sold by Sericol Ltd, and the stencil was treated with an acidified sodium metaperiodate solution (Seristrip Liquid sold by Sericol Ltd) diluted 1 part to 20 parts of water by volume. The screens were then subjected to a high pressure water spray. The results were as follows:

| Screen coating | Assessment of damage | Ease of removal |
| --- | --- | --- |
| DIRASOL 125 | Complete destruction of stencil | Only 20% removed |
| DIRASOL 125 plus 5% w/w of a 40% zirconium acetate solution | Some ink absorption but no apparent damage to stencil | Completely removed |

EXAMPLE 2

This example demonstrates conventional exposure. Screens were coated and dried as in Example 1, placed in a vacuum exposure frame and exposed through a positive using a 6 kW metal halide Parker exposure unit for 3 light units. The screens were developed, dried and tested as in Example 1 and the results were as follows:

| Screen coating | Assessment of damage | Ease of removal |
| --- | --- | --- |
| DIRASOL 125 | Almost complete destruction of stencil | Only 30% removed |
| DIRASOL 125 plus 5% w/w of a 40% zirconium acetate solution | No apparent damage to stencil | Completely removed |

What is claimed is:

1. A photopolymerisable composition for making screen printing stencils, the composition comprising polyvinyl alcohol having at least one photocrosslinkable group appended thereto and a zirconium salt.

2. The composition claimed in claim 1, wherein the at least one photocrosslinkable group is at least one styryl pyridinium salt.

3. A support sheet coated with the composition claimed in claim 2.

4. A screen for screen printing coated with the composition claimed in claim 2.

5. The composition claimed in claim 1, wherein the composition has a pH of between 3.0–9.0.

6. A support sheet coated with the composition claimed in claim 1.

7. A screen for screen printing coated with the composition claimed in claim 1.

8. A method for preparing a stencil for screen printing, the method comprising the step of (a) using the composition comprising polyvinyl alcohol having at least one photocrosslinkable group appended thereto and at least one metal salt wherein the metal is selected from: zinc, chromium, zirconium, titanium, tin and iron to produce a stencil for screen printing.

9. The screen printing stencil produced by the method claimed in claim 7.

10. A method as recited in claim 8 wherein (a) is practiced by using an indirect method for screen printing stencil preparation.

11. A method as recited in claim 8 wherein (a) is practiced by using a direct method for screen printing stencil preparation.

12. A method as recited in claim 8 wherein (a) is practiced by using a capillary film method for screen printing stencil preparation.

13. A method as recited in claim 8 wherein (a) is practiced by using a zirconium salt as the metal salt.

14. A method of using a metal salt wherein the metal is selected from: zinc, chromium, zirconium, titanium, tin and iron, to improve water resistance of a screen printing image which is prepared from a photopolymerisable composition comprising polyvinyl alcohol having at least one photocrosslinkable group appended thereto comprising (a) adding the metal salt to the photopolymerizable composition, and (b) making a stencil from the composition.

15. A method as recited in claim 14 wherein (a) is practiced to add zirconium salt to a photopolymerizable composition having at least one styryl pyridinium salt appended thereto.

16. A method for preparing a stencil for screen printing, the method comprising the step of (a) using the composition comprising polyvinyl alcohol having at least one photocrosslinkable group appended thereto and at least one metal salt wherein the metal is selected from: zinc, chromium, zirconium, titanium, tin and iron and wherein the at least one photocrosslinkable group is at least one styryl pyridinium salt, to produce a stencil for screen printing.

17. The screen printing stencil produced by the method claimed in claim 16.

18. A method as recited in claim 16 wherein (a) is practiced by using an indirect method for screen printing stencil preparation.

19. A method as recited in claim 16 wherein (a) is practiced by using a direct method for screen printing stencil preparation.

20. A method as recited in claim 16 wherein (a) is practiced by using a capillary film method for screen printing stencil preparation.

21. A method as recited in claim 16 wherein (a) is practiced by using a zirconium salt as the metal salt.

22. A screen for screen printing coated with a photopolymerisable composition for making screen printing stencils, the composition comprising polyvinyl alcohol having at least one photocrosslinkable group appended thereto and at least one metal salt, and wherein the metal of the metal salt is at least one selected from the group consisting of aluminum, zinc, chromium, zirconium, titanium, tin and iron.

23. A screen for screen printing coated with a photopolymerisable composition for making screen printing stencils, the composition comprising polyvinyl alcohol having at least one styryl pyridinium salt as a photocrosslinkable group appended thereto and at least one metal salt, and wherein the metal of the metal salt is at least one selected from the group consisting of aluminum, zinc, chromium, zirconium, titanium, tin and iron.

* * * * *